United States Patent
Yamasaki

(10) Patent No.: US 8,354,328 B2
(45) Date of Patent: Jan. 15, 2013

(54) SEMICONDUCTOR DEVICE MANUFACTURING METHOD AND SEMICONDUCTOR DEVICE

(75) Inventor: Junji Yamasaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/960,870

(22) Filed: Dec. 6, 2010

(65) Prior Publication Data

US 2011/0147814 A1 Jun. 23, 2011

(30) Foreign Application Priority Data

Dec. 22, 2009 (JP) .................................. 2009-290359
Aug. 19, 2010 (JP) .................................. 2010-184068

(51) Int. Cl.
*H01L 21/336* (2006.01)
*H01L 21/46* (2006.01)
*H01L 21/30* (2006.01)

(52) U.S. Cl. ........ 438/457; 438/197; 438/455; 438/459; 438/571; 257/E21.229; 257/E21.228; 257/E21.237

(58) Field of Classification Search ........... 257/E21.229, 257/E21.237, E21.228

See application file for complete search history.

(56) References Cited

U.S. PATENT DOCUMENTS

| | | | | |
|---|---|---|---|---|
| 6,982,459 B2 * | 1/2006 | Suzuki et al. | .................. | 257/329 |
| 7,271,415 B2 * | 9/2007 | Takechi | ........................... | 257/72 |
| 8,227,912 B2 * | 7/2012 | Ohmi et al. | .................... | 257/720 |
| 2005/0233499 A1 | 10/2005 | Okuda et al. | | |
| 2006/0273351 A1 | 12/2006 | Ozoe et al. | | |
| 2008/0128711 A1 * | 6/2008 | Okuno et al. | .................... | 257/77 |
| 2009/0309130 A1 * | 12/2009 | Hsieh et al. | .................... | 257/139 |

FOREIGN PATENT DOCUMENTS

| | | |
|---|---|---|
| JP | 3339552 B2 | 8/2002 |
| JP | 2005-303218 A | 10/2005 |
| JP | 2007-19458 A | 1/2007 |

OTHER PUBLICATIONS

Takayanagi et al., English Machine Translated of JP Granted Patent Publication No. 3,339,552, Aug. 16, 2002; (Machine Translated Jan. 24, 2012).*

* cited by examiner

*Primary Examiner* — Mohsen Ahmadi
(74) *Attorney, Agent, or Firm* — Foley & Lardner LLP

(57) ABSTRACT

A semiconductor device includes a vertical type semiconductor element formed by using a silicon substrate, a P type impurity diffusion layer being formed at a back surface of the silicon substrate. The surface of the P type impurity diffusion layer is wet etched to expose a single silicon crystal surface of the P type impurity diffusion layer, and a metal layer having a work function of 4.5 eV or more is disposed to the single silicon crystal surface so that an ohmic contact is made between the single silicon crystal surface of the P type impurity diffusion layer and the metal layer without making a silicon-metal alloy layer between the P type impurity diffusion layer and the metal layer.

9 Claims, 14 Drawing Sheets

US 8,354,328 B2

SEMICONDUCTOR DEVICE MANUFACTURING METHOD AND SEMICONDUCTOR DEVICE

CROSS-REFERENCE TO RELATED APPLICATION

The disclosure of Japanese Patent Application No. 2009-290359 filed on Dec. 22, 2009, and No. 2010-184068 filed on Aug. 19, 2010 the specification, drawings and abstract is incorporated herein by reference in its entirety.

BACKGROUND

1. Field of the Invention

The present invention concerns a method of manufacturing a semiconductor device and the semiconductor device. More specifically, it relates to a method of manufacturing a semiconductor device for supplying a current in a vertical direction, and the semiconductor device.

2. Description of Related Art

Generally, in a semiconductor device controlling a large current, for example, insulated gate bipolar transistors (IGBT), metal-oxide semiconductor filed-effect transistor (MOSFET), diodes, or suchlike, an electronic circuit is formed on one surface of a silicon substrate, and a back surface electrode comprising a plurality of layers is formed at the back surface thereof.

FIG. 8 is an enlarged cross sectional view for a main portion of a semiconductor device 100 of a vertical IGBT structure disclosed in Japanese Patent No. 3,339,552. In the semiconductor device 100, an insulated gate bipolar transistor as an electronic circuit is formed over a silicon substrate. The semiconductor device 100 includes a P type emitter layer 101, an N type base layer 102, a P type base layer 103, an N type emitter layer 104, a gate oxide film 105, a gate electrode 106, an interlayer dielectric film 107, a surface electrode (Al electrode) 108, a back surface electrode 110. The back surface electrode 110 includes an Al layer 111, a Ti layer 112, an Ni layer 113, and an Au layer 114 stacked in this order from the side of the P type emitter layer 101.

The semiconductor device 100 is manufactured by way of the following steps. At first, an N type silicon wafer at a lower impurity concentration is provided, and an insulated gate structure is formed on the surface of the silicon wafer which is used as the N type base layer 102. A P type emitter layer 101 is formed on the back surface of the silicon wafer. Then, the back surface electrode 110 is formed over the P type emitter layer 101. Specifically, after forming the P type emitter layer, the silicon wafer back surface is cleaned to remove a spontaneous oxide film. Then, Al, Ti, Ni, and Au are deposited by using an apparatus capable of depositing them continuously (wafer temperature during vapor deposition: 260° C.). After depositing the films, a heat treatment is conducted at 400 to 450° C. to form an aluminum-silicon alloy layer at the boundary relative to the Al layer 111. Thus, an ohmic contact is attained between the silicon substrate and the back surface electrode 110.

FIG. 9A is an enlarged cross sectional view for a main portion of an IGBT type semiconductor device and FIG. 9B is a view for explaining the constitution of a back surface electrode 229, which is a fragmentary enlarged cross sectional view of a region A in FIG. 9A disclosed in Japanese Unexamined Patent Publication No. 2005-303218. A semiconductor device 200 has an N type silicon substrate 201 at a lower impurity concentration, a silicon oxide film 202, a field dielectric film 204, a P⁻ type semiconductor layer 205, an N⁻ type semiconductor region 206, a trench 207, a thermal oxide film 208, a gate electrode 209, a polycrystal silicon pattern 210, a dielectric film 211, an interconnection 217, a polyimide film 219, an N⁺ type semiconductor region 223, a P⁺ type semiconductor region 224, a back surface electrode 229. The back surface electrode 229 includes an Ni layer 225, a Ti layer 226, an Ni layer 227, and an Au layer 228 stacked in this order from the side of the silicon substrate 201.

The semiconductor device 200 is manufactured by way of the following steps. At first, a silicon wafer comprising N⁻ type single crystal silicon is provided and an insulated gate structure is formed on the surface of the silicon wafer. The N⁺ type semiconductor region 223 is formed on the back surface of the silicon wafer by way of steps of implanting impurity ions having an N conduction type. Further, the P⁺ type semiconductor region 224 is formed in a region shallower than that by way of steps of implanting impurity ions having a P conduction type.

As the back surface electrode 229, after at first cleaning the silicon substrate 201 with hydrofluoric acid, Ni, Ti, Ni, and Au are deposited successively over the back surface of the semiconductor substrate 201 by a sputtering method or a vacuum vapor deposition method. After depositing the films, an alloying treatment (heating treatment) is conducted thereby reacting the Ni layer 225 and the P⁺ type semiconductor region (single crystal silicon) 224 to form a compound as an ohmic contact.

FIG. 10 is an enlarged cross sectional view for a main portion of a semiconductor device 300 of a P channel type power MOSFET structure disclosed in Japanese Unexamined Patent Publication No. 2007-19458. The semiconductor device 300 includes, as shown in FIG. 10, a P⁺ type silicon substrate 301, a P⁻ type drift layer 302, an N type base region 303, an N type body layer 303a, an N⁺ type contact region 303b, a P⁺ type source region 304, a trench 305, a gate dielectric film 306, a gate electrode 307, an interlayer dielectric film 308, a surface electrode (source electrode) 309, a back surface electrode 310, a re-crystallized silicon layer 312. The back surface electrode 310 has an Al layer 310a, a Ti layer 310b, an Ni layer 310c, and an Au-layer 310d stacked in this order from the side of the silicon substrate.

The semiconductor device 300 is manufactured by way of the following steps. At first, a P⁺ type silicon wafer is provided and a gate trench structure is formed on the surface of the silicon wafer. Then, the back surface of the silicon wafer is polished. Thus, an amorphous silicon layer of 10 to 15 nm thickness (not illustrated) is formed. Then, the Al layer 310a is formed over the amorphous silicon layer by sputtering without wet etching the back surface of the P type silicon wafer. The energy in this step is set to 3 kW or higher. Thus, silicon atoms in the amorphous silicon layer are re-arranged together with aluminum atoms to form a recrystallized silicon layer 312 and an ohmic contact between the silicon substrate 301 and the back surface electrode 310 is obtained.

SUMMARY

However, according to the inventor's investigation, it has been found that the technique disclosed in the Patent documents described above involves problems to be improved. The problems are to be described below.

In Japanese Patent No. 3,339,552, the heat treatment is conducted at 400 to 450° C. after forming the back surface electrode 110. Therefore, the metal layer of the back surface electrode shrinks to generate warping in the silicon substrate. The warping in the silicon substrate gives a trouble to the wafer transportation in the subsequent wafer probing and assembling steps. As the size of the silicon substrate increases, warping of the silicon substrate gives more significant problem. Further, the heat treatment has to be conducted in a nitrogen atmosphere while shielding oxygen in order to prevent oxidation of the metal layers constituting the back surface electrode 110. Accordingly, equipment having a special specification is necessary.

Also in Japanese Unexamined Patent Publication No. 2005-303218, the alloying treatment (heat treatment) is conducted after forming the back surface electrode 229. Therefore, it also involves a problem of generating warping in the silicon substrate in the same manner as in Japanese Patent No. 3,339,552.

In Japanese Unexamined Patent Publication No. 2007-19458, A1 is sputtered to the surface of the silicon substrate which is polished at the back surface by an energy of 3 kW or higher as means for providing a semiconductor device without reducing the thickness of the silicon substrate and not conducting the annealing step (heat treatment). Then, the back surface electrode 310 is formed by re-crystallizing the amorphous silicon layer. Thus, the heat treatment after forming the back surface electrode 310 is saved. However, since the thickness of the amorphous silicon layer formed by the polishing of the back surface is not uniform, the contact resistance value of the silicon/Al contact portion formed by Al sputtering becomes not uniform. This results in unevenness of the on resistance. Accordingly, since the uniformity of electric properties in the wafer surface is worsened, this lowers the yield.

The present inventors have made earnest studies for solving the problems described above and have found a manufacturing method capable of solving the problem in a semiconductor in which the surface in contact with the back surface electrode is a P type conduction type to accomplish the present invention.

According to an aspect of the present invention, there is provided a method of manufacturing a semiconductor device including a vertical type semiconductor element formed by using a silicon substrate, and a P type impurity diffusion layer formed at a back surface of the silicon substrate. A wet etching of the surface of the P type impurity diffusion layer is provided to expose a single silicon crystal surface of the P type impurity diffusion layer. A metal layer having a work function of 4.5 eV or more is deposited on the single silicon crystal surface of the P type impurity diffusion layer at a temperature of the silicon substrate of 120° C. or lower. The metal layer having a work function of 4.5 eV or more forms a part of a back surface electrode.

The semiconductor device according to another aspect of the present invention comprises a vertical type semiconductor elements formed in a silicon substrate, and a P type impurity diffusion layer formed at a back surface of the silicon substrate and having a single silicon crystal surface. A metal layer having a work function of 4.5 eV or more is formed to be in contact with the single silicon crystal surface of the P type impurity diffusion layer, a junction surface between the single silicon crystal surface of the P type impurity diffusion layer and the metal layer having a work function of 4.5 eV or more is free from a silicon-metal alloy layer formed from the P type impurity diffusion layer and the metal layer. The metal layer having a work function of 4.5 eV or more forms a part of a back surface electrode.

According to the present invention, since the single silicon crystal surface of the P type impurity diffusion layer is exposed by wet etching the P type impurity diffusion layer formed on the back surface of the silicon substrate, and forming the metal layer having a work function of 4.5 eV or more thereon at a temperature of the silicon substrate of 120° C. or lower, an ohmic contact between the P type impurity diffusion layer and the back surface electrode can be obtained without conducting the heat treatment after depositing the metal layers constituting the back surface electrode as in Japanese Patent No. 3,339,552 and Japanese Unexamined Patent Publication No. 2005-303218. Different from the patterned surface electrode, the back surface electrode is formed over the entire back surface of the silicon substrate. Therefore, while large warping is caused upon shrinkage by the heat treatment, since the temperature of the silicon substrate is set to 120° C. or lower upon forming the back surface electrode in the present invention, the problem of warping accompanying the shrinkage of the back surface electrode can be improved. Further, since the surface of the back surface electrode at least in contact with the P type impurity diffusion layer is provided with a metal layer having a work function of 4.5 eV or more, this forms a junction surface where the single silicon crystal surface and the metal layer having a work function of 4.5 eV or more are in contact with each other thereby capable of favorably keeping the resistance value of the ohmic contact.

The present invention provides an excellent effect capable of providing a semiconductor device that can reduce the amount of warping and the on resistance value of the back surface electrode formed on the back surface of the silicon substrate, as well as a manufacturing method thereof.

DESCRIPTION OF THE ACCOMPANYING DRAWINGS

DETAILED DESCRIPTION OF THE PREFERRED EMBODIMENTS

The semiconductor device according to the present invention comprises a vertical type semiconductor element having a surface electrode on the surface of the silicon substrate, and a back surface electrode on the back surface of the silicon substrate in which a current is caused to flow between the surface electrode and the back surface electrode. As an example of the semiconductor element, an example of a preferred embodiment to which the present invention is applied is to be described while taking a vertical type MOSFET as an example of the semiconductor element. It will be apparent that other embodiments can be included within a range of the present invention so long as they conform to the gist of the present invention. Further, the size and the ratio in each of the components in the subsequent drawings are only for the convenience of explanation and are different from actual size or ratio.

Embodiment 1

Figure 1:
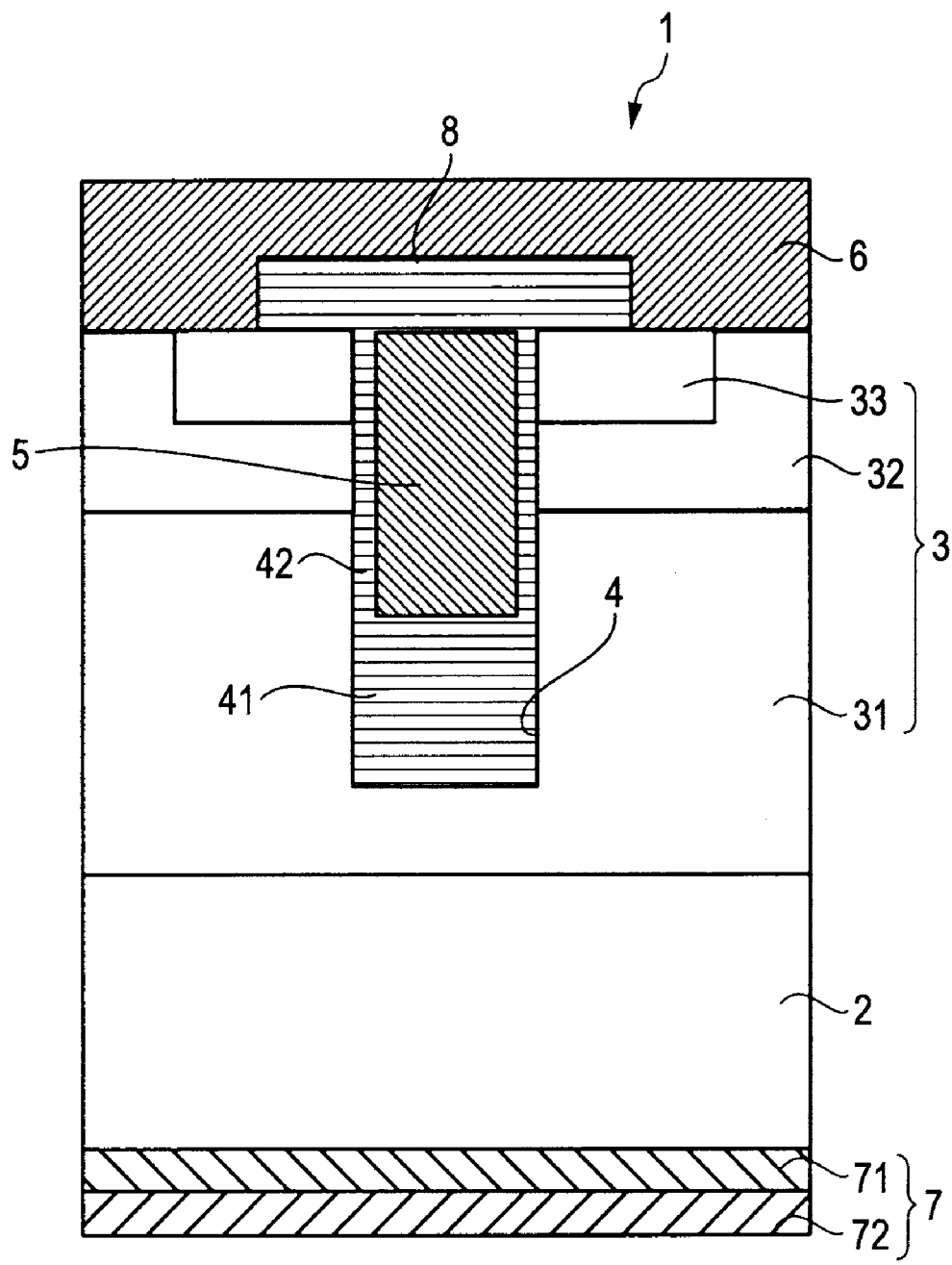
FIG. 1 is an enlarged cross sectional view for a main portion of a semiconductor device according to Embodiment 1.

FIG. 1 shows an enlarged cross sectional view for a main portion of a semiconductor device according to Embodiment 1. The semiconductor device 1 comprises a semiconductor layer 3 in which a P$^-$ type drift region 31, an N type body region 32, a P$^+$ type source region 33 are formed over a P type silicon substrate 2 that functions as a P type impurity diffusion layer. Further, the semiconductor device 1 comprises a trench 4, a gate electrode 5, a surface electrode 6, a back surface electrode 7, an interlayer dielectric film 8, a bottom-buried dielectric layer 41, and a gate dielectric film 42.

The P type silicon substrate 2 is a single crystal semiconductor substrate (single crystal silicon wafer) containing impurities having P conduction type (for example B (boron)). The concentration of impurities in the P type silicon substrate 2 can be set, for example, to about $1\times10^{20}$ cm$^{-3}$. While the resistance of the P type silicon substrate 2 is not particularly restricted, it is preferably 1 mΩ·cm or more with a view point of easy manufacture. Further, it is preferred that the resistance of the P type silicon substrate 2 is 10 mΩ·cm or less with a view point of keeping the ohmic property favorably. The resistance can be controlled easily by changing the impurity concentration. In this Embodiment 1, a substrate having a resistance of about 4 mΩ·cm and containing B as impurities is used as the P type silicon substrate 2. A P$^-$ type drift region 31 is formed over the P type silicon substrate 2.

The trench 4 is formed so as to extend from the surface of the semiconductor layer 3 in the direction of the depth. Specifically, the trench 4 is formed from the surface of the semiconductor layer 3 passing through the N type body region 32 and reaches as far as the P$^-$ type drift region 31.

The bottom-buried dielectric layer 41 is formed to a bottom portion inside the trench 4. The bottom-buried dielectric layer 41 may be formed of one kind of layer or may be formed of a plurality of different layers comprising an dielectric layer covering the wall surface, a dielectric layer burying the inside of the bottom portion. For the material of the bottom-buried dielectric layer 41, known materials can be used with no restriction. The upper surface of the bottom-buried dielectric layer 41 situates at a position somewhat deeper than the lower surface of the N type body region 32 in the direction of the trench depth.

The gate dielectric film 42 covers the wall surface of the trench 4 not covered with the bottom-buried dielectric layer 41. The gate dielectric film 42 is formed of an oxide film of the semiconductor layer 3 or suchlike.

The gate electrode 5 is formed in the trench 4 where the bottom-buried dielectric layer 41 and the gate dielectric film 42 are disposed. Accordingly, the gate electrode 5 is disposed above the bottom-buried dielectric layer 41 and opposes the wall surface of the trench 4 via the gate dielectric film 42 therebetween. The gate electrode 5 functions as a conductor in the trench 4. The material of the gate electrode 5 is not particularly restricted and can be formed, for example, of polysilicon. The gate electrode 5 opposes the P$^+$ type source region 33 and the N type body region 32 via the gate dielectric film 42 formed on the wall surface of the trench 4 therebetween.

The P$^+$ type source region 33 is formed along the trench 4 on the surface portion of the P$^+$-body region 32 so as to be in contact with the gate dielectric film 42.

The surface electrode 6 is disposed on the side of the surface of the semiconductor layer 3 and functions as a source electrode. A portion of the surface electrode 6 is disposed so as to be in contact with the P$^+$ type source region 33, and the surface electrode 6 is connected electrically with the P$^+$-source region 33 and the N type body region 32. The material of the surface electrode 6 is not particularly restricted, and known materials including Al or suchlike can be applied with no restriction.

The back surface electrode 7 is formed on the main surface of the P type silicon substrate 2 on the side of the back surface and functions as a drain electrode. A metal layer having a work function of 4.5 eV or more is disposed to the surface of the back surface electrode 7 at least on the surface in contact with the P type silicon substrate 2. The back surface electrode 7 may be formed of only one kind of metal film, or may be formed of a plurality of layers in stack. The metal layer forming the back surface electrode 7 may also be an alloy layer.

In the back surface electrode 7, a preferred example of the metal layer in contact with the P type silicon substrate 2 includes, for example, Ni (fm (work function): 4.50 eV), Au (fm: 4.80 eV), Cr (fm: 4.60 eV), Pt (fm: 5.40 eV). While the upper limit value of the work function is not particularly restricted, the work function is preferably 6.0 eV or less with a view point of easy availability and/or cost performance. Since Ti (fm: 3.95 eV) and Al (fm: 4.20 eV) have a work function of less than 4.5 eV, they are not used as the metal layer of the back surface electrode 7 which is in contact with the P type silicon substrate 2.

The main surface of the back surface electrode 7 on the side opposite to the P type silicon substrate 2 is mounted on a lead frame (not shown) by way of a joining material such as a solder (not shown). Therefore, it is preferred that the metal layer at the outermost surface that configures the back surface electrode 7 (main surface on the side opposite to the substrate) is formed of a material capable of providing good adhesion with the joining material.

In a case where the metal layer having a work function of 4.5 eV or more has poor adhesion with the joining material such as a solder, a metal layer for improving the adhesion with the joining material such as the solder is stacked over the back surface of the metal layer having a work function of 4.5 eV or more. In a case where there is a problem in the adhesion between the metal layer used for improving the adhesion with the joining material and the metal layer having the work function of 4.5 eV or more, other metal layer may be disposed between them. However, the number of stacks of the back surface electrode 7 is preferably smaller with a view point of simplifying the manufacturing steps and reducing the cost. The thickness for each of the metal layers is not particularly restricted. The thickness of the back surface electrode 7 can be, for example, about 400 nm to 2000 nm.

As the back surface electrode 7, that having a 2-layered structure comprising a first metal layer 71 and a second metal layer 72 is used in Embodiment 1. Specifically, an Ni layer having a work function of 4.5 eV was used as the first metal layer 71 in contact with the $P^+$ type silicon substrate 2 and an Ag layer was used as the second metal layer 72 disposed on the back surface of the first metal layer 71.

Then, a method of manufacturing the semiconductor device 1 is to be described with reference to FIG. 2A to FIG. 2D. At first, a $P^-$ type silicon layer 31 is formed by epitaxial growing over the P type silicon substrate 2. Then, an $N^-$ type body region 32 and a $P^+$ type source region 33 are formed to predetermined regions typically by ion implantation.

Then, a trench 4 reaching a $P^-$ type drift region 31 is formed by dry etching. Then, a bottom-buried dielectric layer 41 is formed to a predetermined depth of the trench 4 (refer to FIG. 2A). While the method of forming the bottom-buried dielectric layer 41 is not particularly restricted, the layer can be formed easily by using a CVD method and a dry etching method, or the like.

Then, a gate dielectric film 42 is formed to the substrate surface and the side wall of the trench 4 typically by a thermal oxidation method. Then, polysilicon is deposited inside the trench 4 by a CVD method. Thus, a gate electrode 5 is formed on the bottom-buried dielectric layer 41 and the gate dielectric film 42 (refer to FIG. 2B).

Figure 2A:
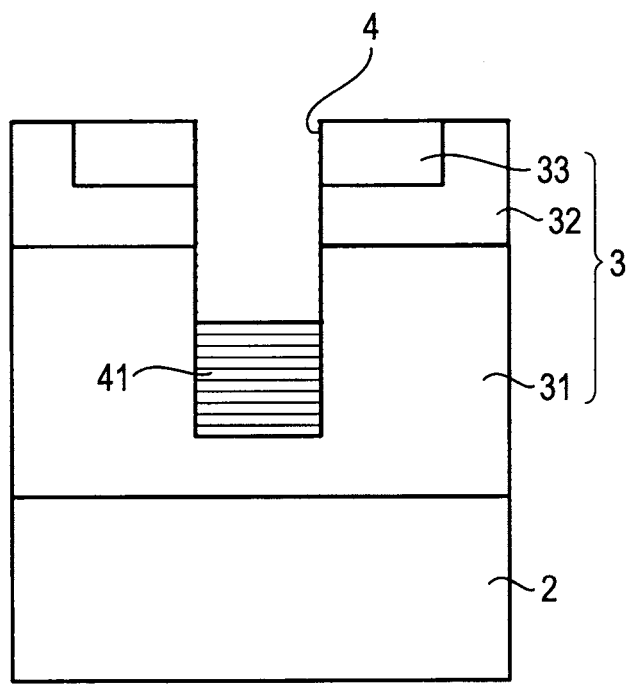
FIG. 2A is a cross sectional view for a manufacturing steps of a semiconductor device according to Embodiment 1.
Figure 2B:
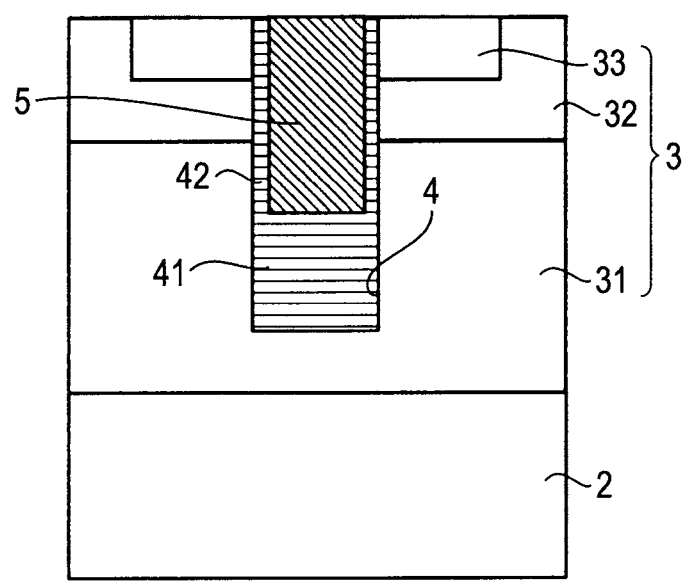
FIG. 2B is a cross sectional view for a manufacturing steps of a semiconductor device according to Embodiment 1.
Figure 2C:
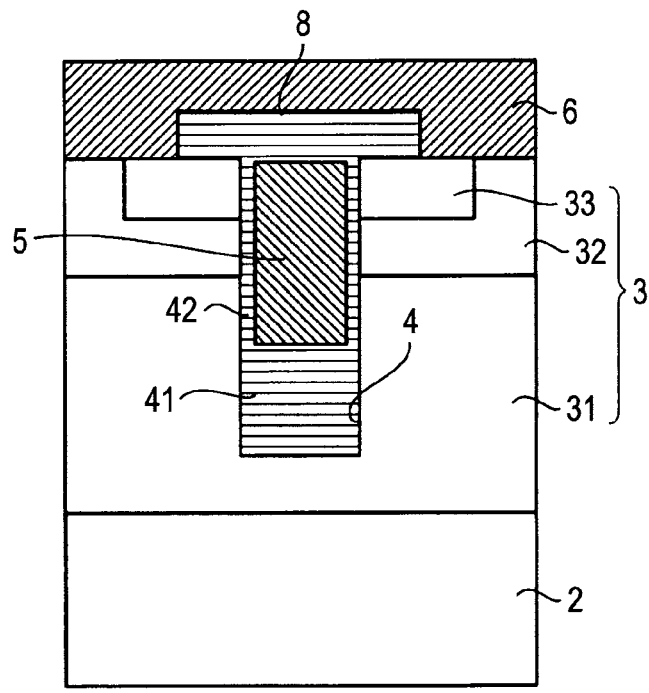
FIG. 2C is a cross sectional view for a manufacturing steps of a semiconductor device according to Embodiment 1.

Then, a pattern of an interlayer dielectric film 8 is formed and a surface electrode 6 is patterned at a desired position (refer to FIG. 2C).

Successively, the entire back surface of the P type silicon substrate 2 is etched back by a wet etching method. A surface portion of the back surface of the P type silicon substrate 2 may be grinded off and mirror polished so as to be thinned to a predetermined thickness before providing the etching back process by the wet etching method. Thus, the surface of the P type silicon substrate 2 is formed as a single silicon crystal surface. The etchant is not particularly restricted so long as it does not depart the spirit of the present invention and includes, for example, a liquid mixture of hydrofluoric acid, nitric acid, sulfuric acid, and phosphoric acid.

Then, a back surface electrode 7 is formed over the entire back surface of the P type silicon substrate 2. In this case, the temperature of the P type silicon substrate 2 is controlled to 120° C. or lower. A heat treating step is not conducted in the step after the deposition of the first metal layer 71 and the second metal layer 72 and before dicing cut of the silicon wafer.

For the temperature of the silicon substrate upon forming the back surface electrode 7, the lower limit value is not particularly restricted so long as the temperature is 120° C. or lower. The temperature of the P type silicon substrate 2 may be lowered to lower than the normal temperature by water cooling or the like. With a view point of more effectively improving the warping caused by the formation of the back surface electrode 7, the temperature upon forming the back surface electrode 7 is more preferably 100° C. or lower and, particularly preferably, 80° C. or lower.

Figure 2D:
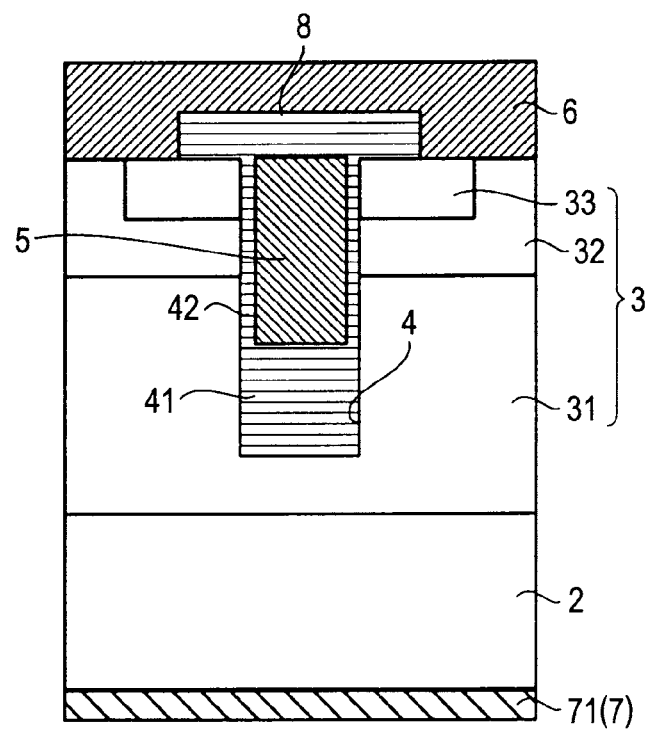
FIG. 2D is a cross sectional view of a manufacturing steps of a semiconductor device according to the Embodiment 1.

For the back surface electrode 7, a first metal layer 71 is obtained by at first depositing an Ni layer over the back surface of the P type silicon substrate 2 by a lower temperature sputtering method (refer to FIG. 2D). The effect of the present invention can be obtained also in a case where the lower limit of the thickness of the first metal layer 71 is about that of a several atom layer. Successively, the second metal layer 72 is obtained by depositing an Ag layer over the back surface of the first metal layer 71 by a lower temperature sputtering method.

The semiconductor device 1 according to this Embodiment 1 is manufactured by way of the steps described above (refer to FIG. 1). The semiconductor device 1 obtained as described above is mounted to leads of a lead frame, for example, by way of a joining material such as a solder.

In a case of forming the silicon-metal alloy layer by a heat treatment step as means for obtaining the ohmic contact, a number of grains are formed at the boundary by eutectic transformation of silicon and metal. It is considered that the size of the number of grains is not uniform and this may result in the warping.

On the other hand, the junction surface between the silicon substrate 2 and the back surface electrode 7 of the semiconductor device 1 according to Embodiment 1 provides an ohmic contact due to substantially physical adsorption. Since this Embodiment 1 forms a junction surface where the single crystal silicon surface and the metal layer having a work function of 4.5 eV or more are joined, the boundary between the silicon substrate 2 and the back surface electrode 7 is uniform and free of non uniformity owing to the heat treatment. In the case of the silicon-metal alloy layer, elements constituting mating layers are detected from the vicinity at the boundary of the silicon substrate and the back surface electrode respectively. On the contrary, in a case of the ohmic contact obtained by the physical adsorption, elements constituting the adjacent layers are not detected substantially from both regions in the vicinity of the boundary between the silicon substrate and the back surface electrode.

Then, explanation is to be made for the reason why at least a metal layer in contact with the silicon substrate 2 having a work function of 4.5 eV or more is used as the back surface electrode in the semiconductor device according to Embodiment 1.

Figure 3A:
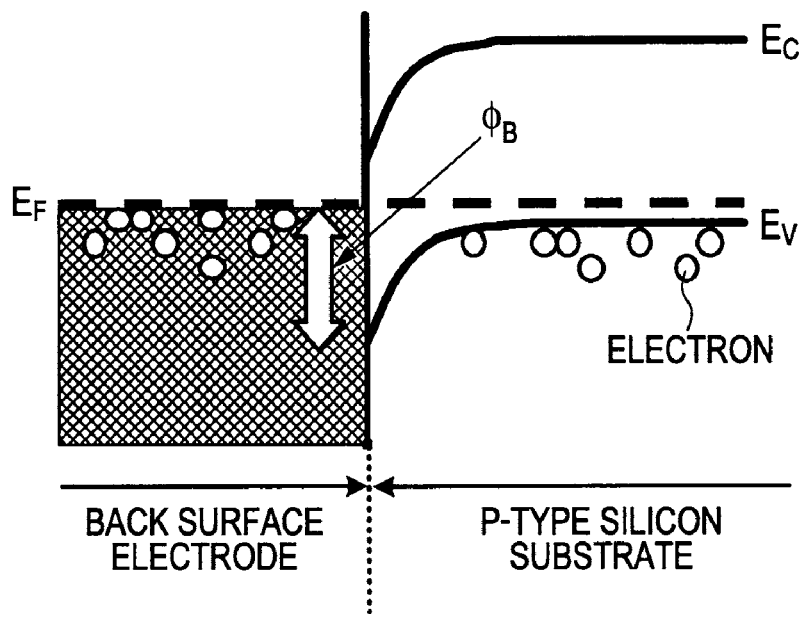
FIG. 3A is a view for explaining an energy barrier $\phi_B$ between a P type silicon substrate and a back surface electrode.

FIG. 3A shows a energy barrier $\phi_B$ when a back surface electrode is deposited to the single crystal surface of the P type silicon substrate. In the drawing $E_F$ represents a Fermi level, $E_c$ represents minimum energy of a conduction band, and $E_v$ represents a maximum energy of a valence band. Generally, $\phi_B$ is higher for Ti (fm: 3.95 eV) or Al (fm: 4.20 eV) used as the back surface electrode. Therefore, the on resistance value increases. On the other hand, in a case of Ni (fm: 4.50 eV), $\phi_B$ can be lowered. As a result, a good on resistance value can be obtained.

By the way, in Japanese Unexamined Patent Publication No. 2007-19458, since Al is used, $\phi_B$ increases and the on resistance remains at a higher value. Further, since Al is sputtered to the amorphous silicon layer polished at the back surface and not formed as the single crystal surface, the uniformity at the boundary is lost. Accordingly, this results in not uniform contact resistance value to the silicon/Al contact portion to make the on resistance value not uniform. Further, while it is described in Japanese Unexamined Patent Publication No. 2007-19458 that Au may be used instead of Al, the defect described above still remains since Au is sputtered to the amorphous silicon layer.

According to the semiconductor device of Embodiment 1, a back surface electrode at a lower contact resistance value can be manufactured without conducting the heat treatment. As a result, this can make the manufacturing process simple and convenient and reduce the manufacturing cost.

Further, according to the semiconductor device of Embodiment 1, since it is not necessary to prepare the metal layer for forming the metal-silicon alloy layer as in Japanese Patent No. 3,339,552 and Japanese Unexamined Patent Publication No. 2005-303218, the number of stacks for the back surface electrode can be decreased. As a result, it is possible to decrease the cost and make the manufacturing process simple and convenient. Further, according to the semiconductor device of Embodiment 1, since the amorphous silicon layer is not interposed at the boundary between the metal layer and the silicon substrate as in Japanese Unexamined Patent Publication No. 2007-19458, the contact resistance value of the back surface electrode can be made uniform.

Further according to the semiconductor device of Embodiment 1, since the back surface electrode is formed at the substrate temperature of the silicon substrate of 120° C. or lower, warping caused by the shrinkage of the back surface electrode can be improved drastically. In addition, since the first metal layer 71 of the back surface electrode 7 that is in contact with the P type silicon substrate 2 having a work function of 4.5 eV or more is used and joined to the single silicon crystal surface, lower on resistance can be realized.

Embodiment 2

Then, an example of a semiconductor device different from Embodiment 1 is to be described. In the subsequent description, identical members with those of the embodiment described above and the examples of the prior art carry the same reference numerals for which the explanation is to be omitted optionally.

Figure 3B:
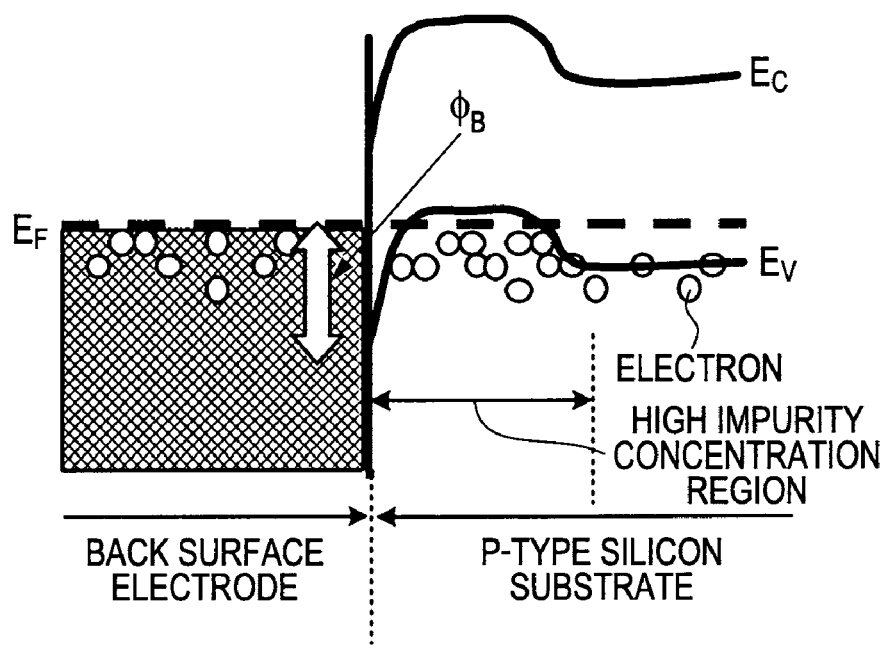
FIG. 3B is a view for explaining an energy barrier $\phi_B$ between a P type silicon substrate and a back surface electrode.

Embodiment 1 described above shows an example in which a metal layer having a work function of 4.5 eV or more is in contact with the P type silicon substrate. However, the present invention is applicable not being restricted only to Embodiment 1 but also applicable to a semiconductor device in which an impurity region at a higher concentration of P type impurity is formed to a P type silicon substrate or an N type silicon substrate at a lower impurity concentration by ion implantation or the like. FIG. 3B shows an energy barrier $\phi_B$ when an impurity region at higher concentration of P type impurity is provided to the single crystal surface of a P type silicon substrate by ion implantation or the like and a back surface electrode is deposited over the single crystal surface. By the provision of the impurity region at the higher concentration, it is possible to reduce the thickness of the depletion layer extremely to realize an ohmic contact by the tunnel effect. Accordingly, a good on resistance value can be obtained by providing the impurity region at a higher concentration. That is, it may suffice that the surface in contact with the metal layer having a work function of 4.5 eV or more is a P type single silicon crystal surface at a higher impurity concentration and this may be a case where the P type impurities are doped at a higher concentration upon pulling up of an ingot or a case where P type impurities are doped to the silicon substrate at a higher concentration by ion implantation or the like.

In a case of ion implanting P type impurities to the silicon substrate, laser annealing is conducted to activate the impurities to form a P type impurity diffusion layer where the P type impurity concentration is increased finally, for example, to $5 \times 10^{18}$ to $5 \times 10^{20}$ cm$^{-3}$. Then, the surface of the P type impurity diffusion layer is wet etched to expose the single crystal surface of the P type impurity diffusion layer, and a metal layer having a work function of 4.5 eV or more is deposited at a temperature of 120° C. or lower. What is important is that the silicon substrate is not exposed to such a higher temperature that the metal layer is alloyed with the silicon substrate upon deposition and after deposition of the metal layer to the back surface of the silicon substrate. Since the silicon-metal alloy layer cannot be formed unless the metal layer is formed at the back surface of the silicon substrate, there is no problem when a heat treatment is conducted for activating the impurities. However, it is preferred to conduct laser annealing so that there is no effect on the element formed on the side of the surface of the silicon substrate.

Referring further to the concentration range of the P type impurity diffusion layer, the concentration is preferably $5 \times 10^{18}$ cm$^{-3}$ or higher with a view point of keeping the contact resistance more favorable with the metal layer having the work function of 4.5 eV or more. Further, with a view point of obtaining the single crystal surface favorably at a good yield, it is preferred to control the P type impurity concentration to $5 \times 10^{20}$ cm$^{-3}$ or less.

Figure 4:
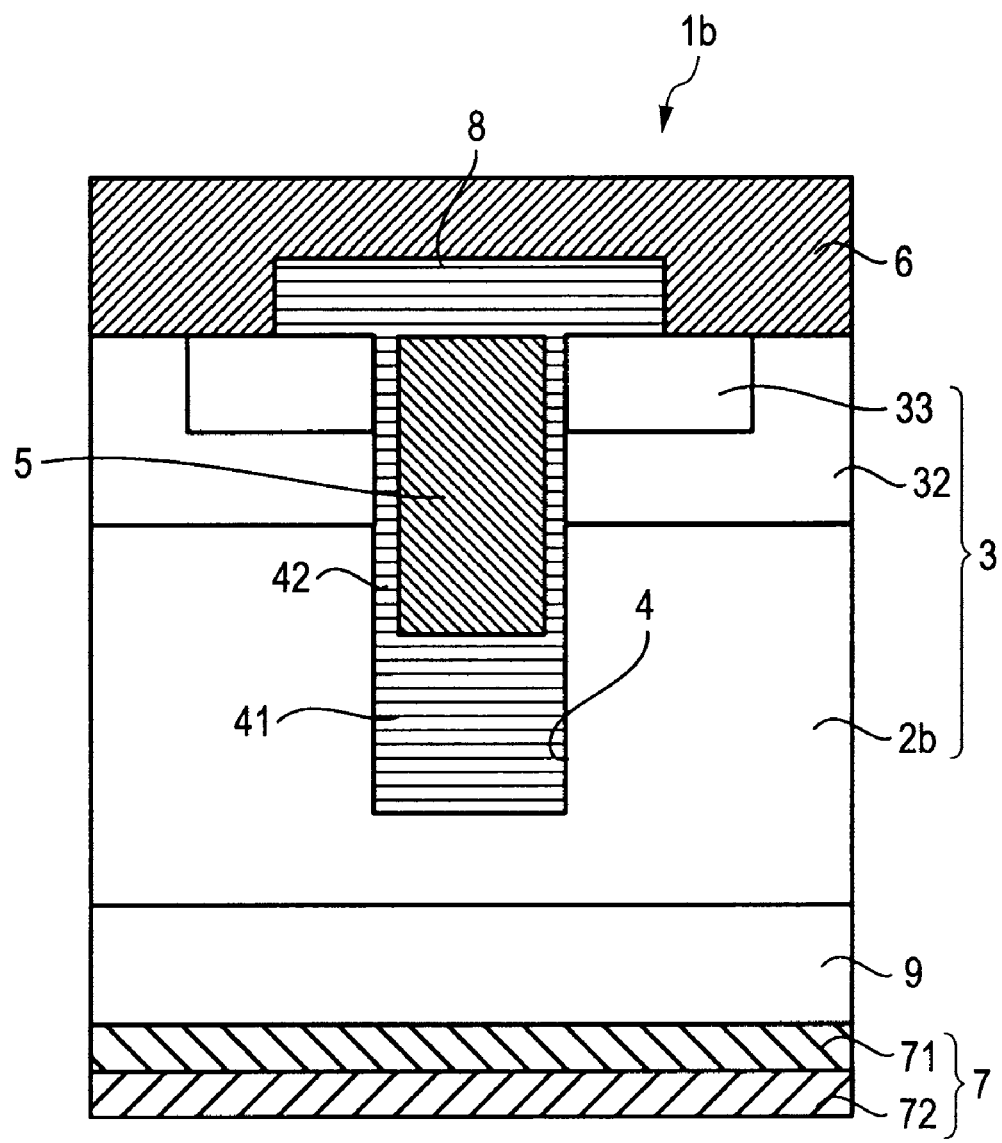
FIG. 4 is an enlarged cross sectional view for a main portion of a semiconductor device according to Embodiment 2.

FIG. 4 is an enlarged cross-sectional view for a main portion of a semiconductor device 1b according to Embodiment 2. The semiconductor device 1b is an example of applying a P type impurity diffusion layer 9 formed by ion implantation and laser annealing to the vertical type MOSFET according to Embodiment 1 described above.

In the semiconductor device 1b, the P⁻ type drift region 31 shown in FIG. 1 is replaced with a P⁻ type silicon substrate 2b and a P type impurity diffusion layer 9 is formed to the back surface of the P⁻ type silicon substrate (P⁻ type drift region) 2b by ion implantation and laser annealing. Then, the semiconductor device 1b can be obtained by wet etching the surface of the P type impurity diffusion layer 9 to expose the single crystal surface and depositing a first metal layer (for example, Ni layer) 71 having a work function of 4.5 eV or more and a second metal layer (for example, Ag layer) 72 at 120° C. or lower to form a back surface electrode 7.

According to Embodiment 2, since the P type impurity diffusion layer 9 formed on the side of the back surface of the silicon substrate 2b is wet etched to expose the single silicon crystal surface and the back surface electrode having a work function of 4.5 eV or more is brought into contact therewith, the same effect as that in Embodiment 1 described above can be obtained.

Embodiment 3

Figure 5:
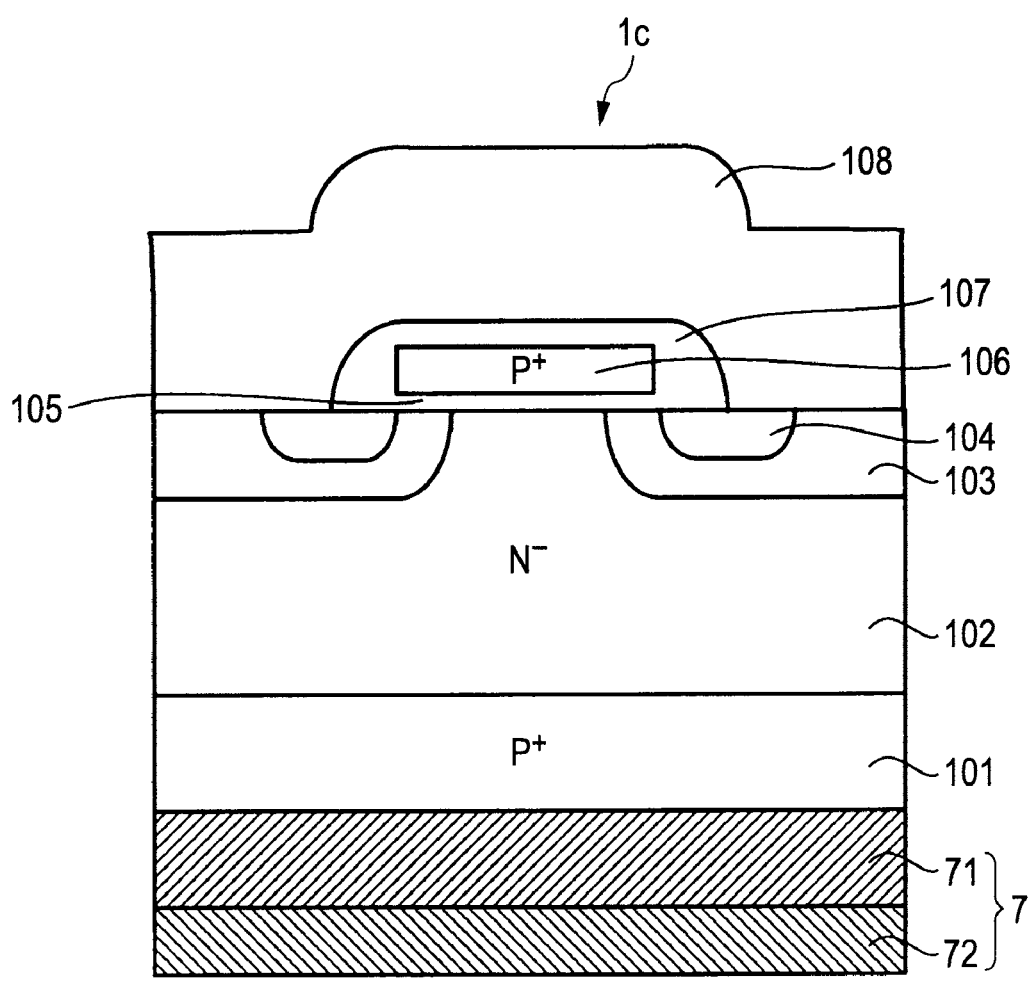
FIG. 5 is an enlarged cross sectional view for a main portion of a semiconductor device according to Embodiment 3.
Figure 8:
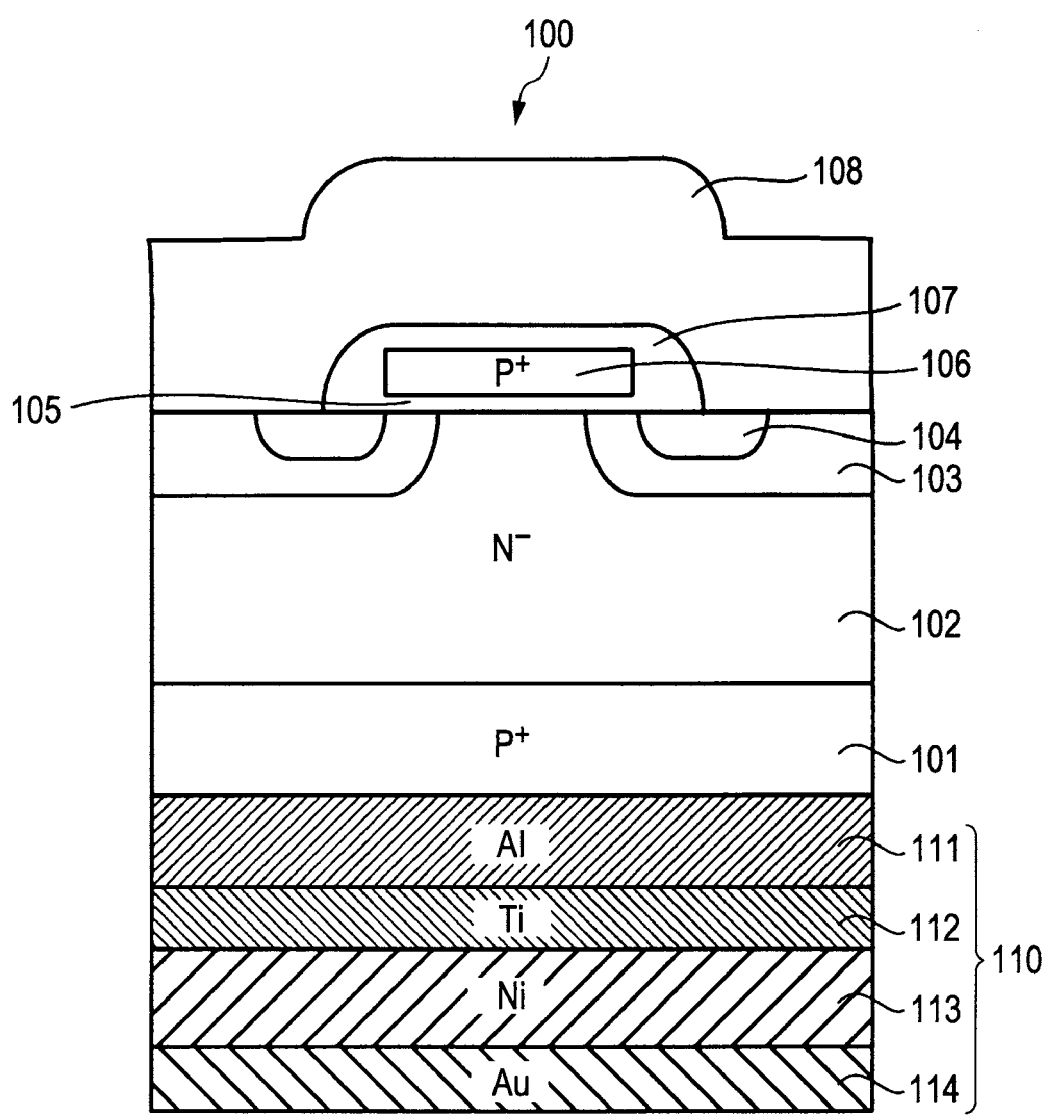
FIG. 8 is an enlarged cross sectional view for a main portion of a semiconductor device according to Japanese Patent No. 3,339,552.
Figure 9A:
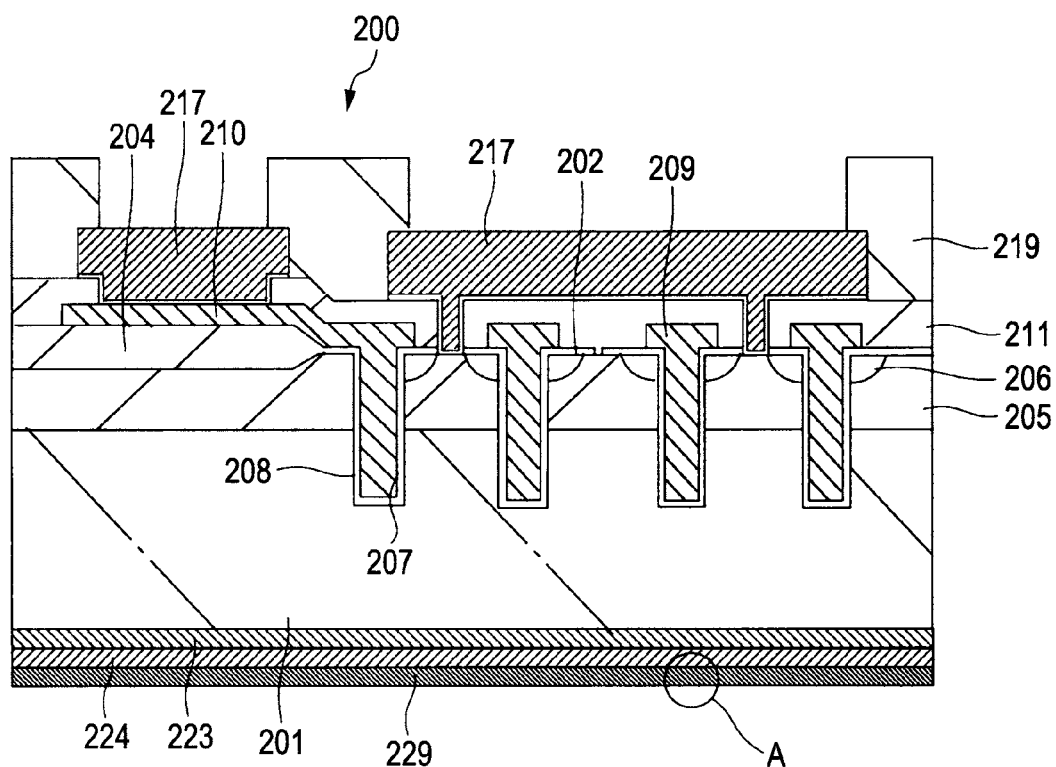
FIG. 9A is an enlarged cross sectional view for a main portion of a semiconductor device according to Japanese Unexamined Patent Publication No. 2005-303218.
Figure 9B:
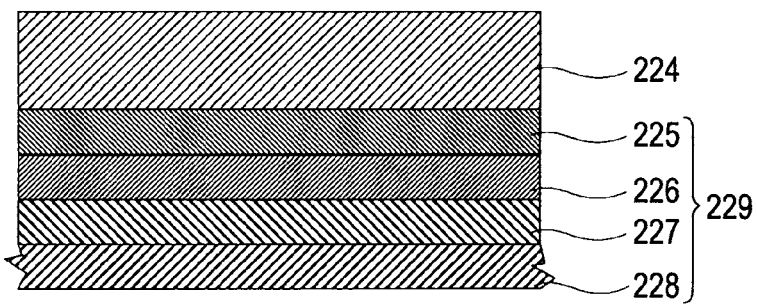
FIG. 9B is an enlarged cross sectional view for a region A in FIG. 9A.
Figure 10:
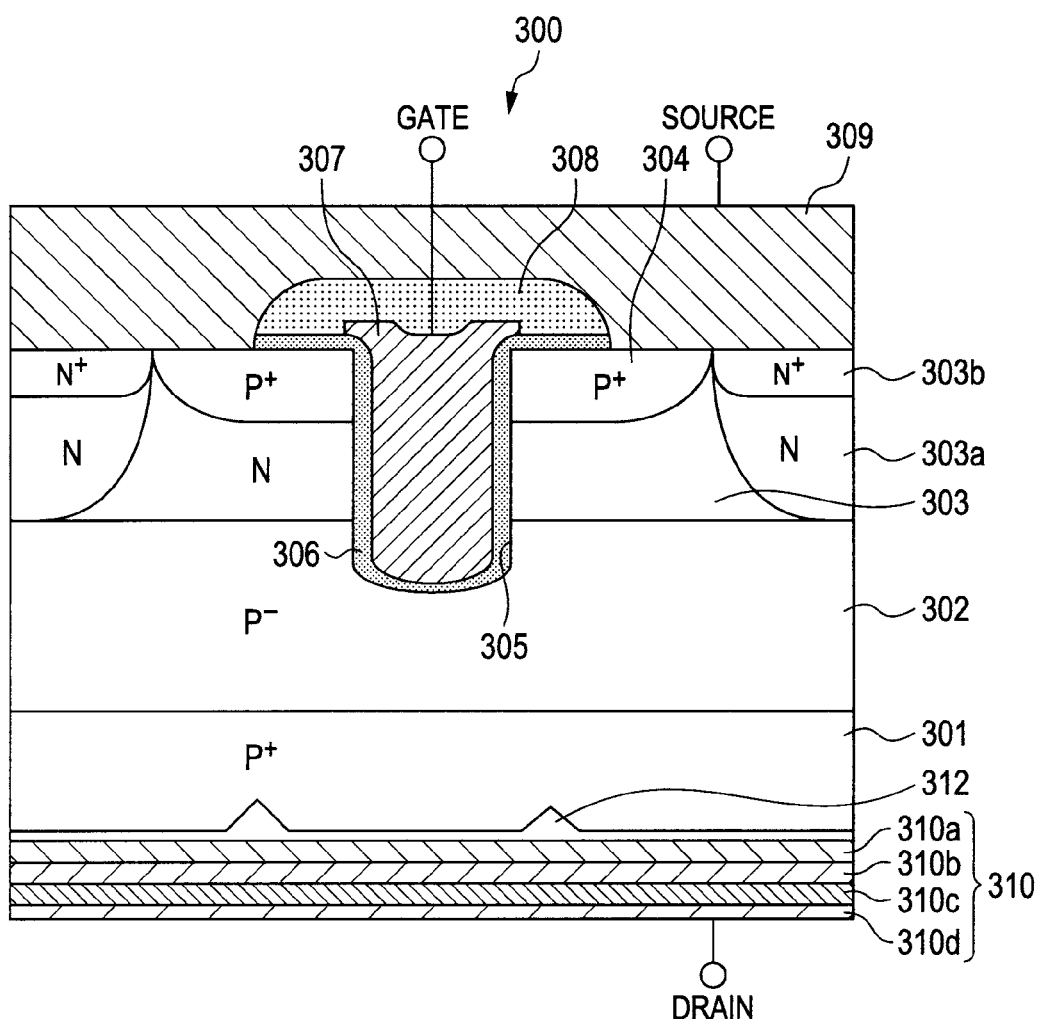
FIG. 10 is an enlarged cross sectional view for a main portion of a semiconductor device according to Japanese Unexamined Patent Publication No. 2007-19458.

FIG. 5 is an enlarged cross sectional view for a main portion of a semiconductor device 1c according to Embodiment 3. The semiconductor device 1c is an example of applying the back surface electrode 7 described above to a vertical type IGBT shown in FIG. 8. The semiconductor device 1c is an example of forming a P type emitter layer 101 that functions as a P type impurity diffusion layer to the side of the back surface of the N type base layer 102 formed of the N type silicon substrate for example by ion implantation and laser annealing and the surface is wet etched to expose the single crystal surface to which a first metal layer (for example, Ni layer) 71 having a work function of 4.5 eV or more and a second metal layer (for example, Ag layer) 72 at 120° C. or lower to form the back surface electrode 7. In a case where the impurity concentration of the entire P type emitter layer 101 cannot be increased due to the restriction of breakdown voltage, for example, a P type impurity diffusion layer at a higher impurity concentration (not illustrated) may be formed at the surface on the back surface of the P type emitter layer 101 by ion implantation and laser annealing.

According to Embodiment 3, since the P type emitter layer 101 as the P type impurity diffusion layer formed on the side of the back surface of the silicon substrate is wet etched to expose the single silicon crystal surface and a back surface electrode having a work function of 4.5 eV or more is formed so as to be in contact therewith, the same effect as that in Embodiment 1 can be obtained.

In the Embodiments 1 to 3, examples are shown in which Ni is used as the first metal layer 71 and Ag is used as the second metal layer 72 but this is merely an example and they can be formed as various metal layers within a range not departing the spirit of the present invention. A preferred combination of the first metal layer 71 and the second metal layer 72 can include, for example, Cr—Ag, Cr—Au, Ni—Au, Pt—Ag, Pt—Au, and Au—Ag.

Figure 6:
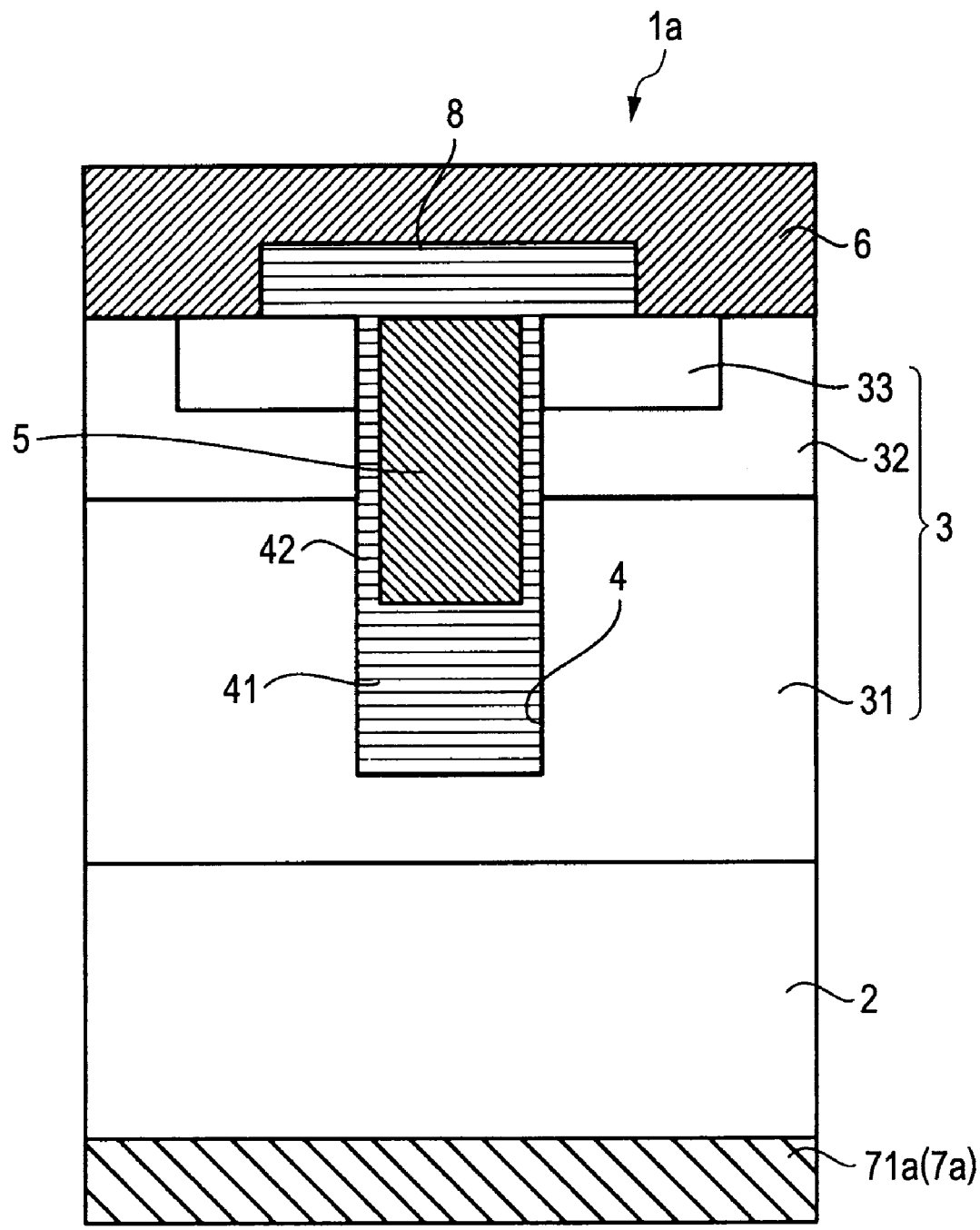
FIG. 6 is an enlarged cross sectional view for a main portion of a semiconductor device according to another embodiment.

Further, in Embodiments 1 to 3 described above, while an example in which the back surface electrode 7 comprises a two layered structure of a first metal layer 71 and a second metal layer 72 has been described, the back surface electrode 7 may also be formed of only one layer or three or more stacked layers. In a case where the adhesion for the P type silicon substrate 2 and the joining material such as a solder is compatible by stacking only one layer, only the first metal layer 71a may be disposed as the back surface electrode 7a as shown in the semiconductor device la of FIG. 6. A preferred example for the material of the first metal layer 71a can include Au. In a case where the junction between the first metal layer 71a in contact with the P type silicon layer 2 and the metal layer in contact with the joining material such as a solder (not shown) disposed at the outermost surface is not good, a plurality of metal layers may also be disposed between them as described above.

Further, in Embodiments 1 to 3 described above, while the examples of the power MOSFET and the vertical IGBT of the trench gate structure are described as examples of the semiconductor device, the present invention is not restricted to them but is applicable suitably to various kinds of devices including diodes or suchlike. In other words, the present invention is applicable generally to semiconductor devices having a vertical type semiconductor element having a surface electrode on the side of the surface and a back surface electrode on the side of the back surface of the P type impurity diffusion layer in which current is caused to flow between the surface electrode and the back surface electrode.

EXAMPLES

The present invention is to be described more specifically by way of specific examples. However, the present invention is not restricted at all to the following examples.

Example 1

A P type silicon substrate (P type silicon wafer) that functions as a P type impurity diffusion layer is provided. The P type silicon substrate used has a resistance of 4 mΩ·cm (same substrate was used also in comparative examples). Then, a semiconductor element having the gate trench structure as shown in FIG. 1 was formed on the side of the surface of the P type silicon substrate. Then, the back surface of the P type silicon substrate was subjected to a wet etching treatment to expose the single crystal surface. A liquid mixture of hydrofluoric acid, nitric acid, sulfuric acid, and phosphoric acid was used as an etchant upon wet etching. Then, Ni was deposited as a first metal layer on the back surface of the P type silicon substrate by a lower temperature sputtering method. Then, Ag was deposited as a second metal layer by a lower temperature sputtering method. The temperature of the P type silicon substrate during lower temperature sputtering was set to 80° C. By way of the steps described above, a back surface electrode of a 2-layered structure comprising a first metal layer formed of Ni and a second metal layer formed of Ag was formed.

Comparative Example 1

The same P type silicon substrate (P type silicon wafer) as in Example 1 was provided and a semiconductor element having the gate trench structure as shown in FIG. 1 was formed on the side of the surface of the P type silicon substrate. Then, without applying wet etching treatment to the side of the back surface of the P type silicon substrate, a Ti layer, an Ni layer, and an Ag layer were continuously deposited in this order to the back surface of the P type silicon substrate by a vapor deposition method. After depositing the films, they were subjected to a heat treatment at 400° C. in a nitrogen atmosphere to form an Ni-silicon alloy layer.

Comparative Example 2

A sample was manufactured in the same method as in Example 1 except for forming a Ti layer, a Ni layer, and an Ag layer in this order instead of the Ni layer and the Ag layer as the back surface electrode that functions as the back surface electrode.

Comparative Example 3

A sample was manufactured in the same method as in Example 1 except for forming an Al layer, a Ti layer, an Ni layer, and an Ag layer in this order instead of the Ni layer and the Ag layer as the back surface electrode that functions as the back surface electrode.

Figure 7:
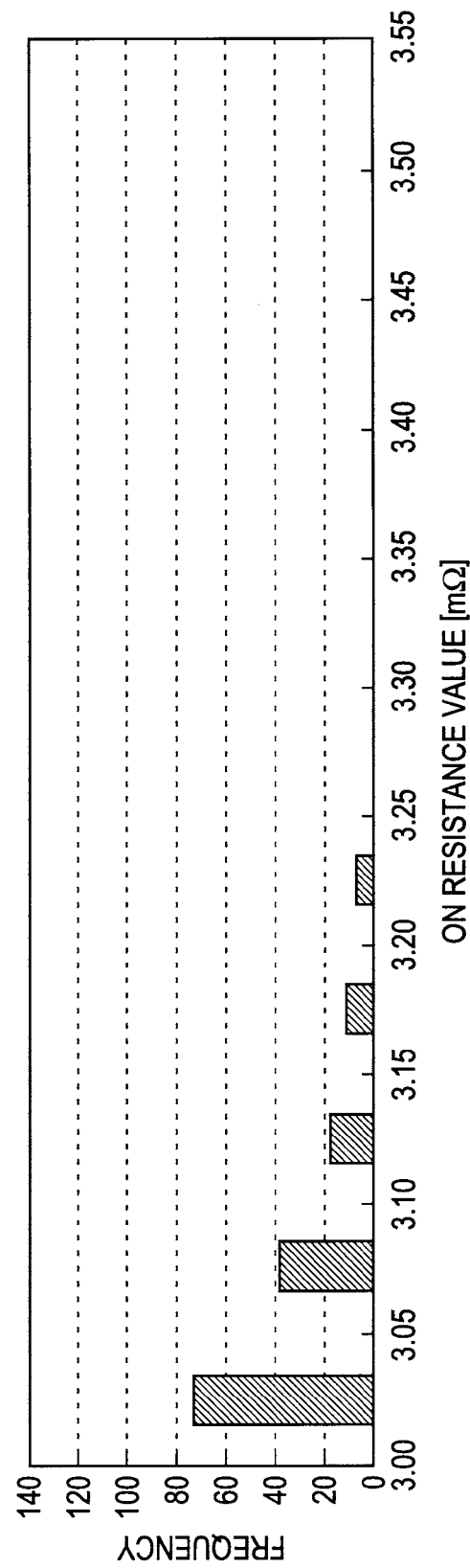
FIG. 7 is a frequency distribution graph showing the on resistance value of a semiconductor device according to Example 1.
Figure 11:
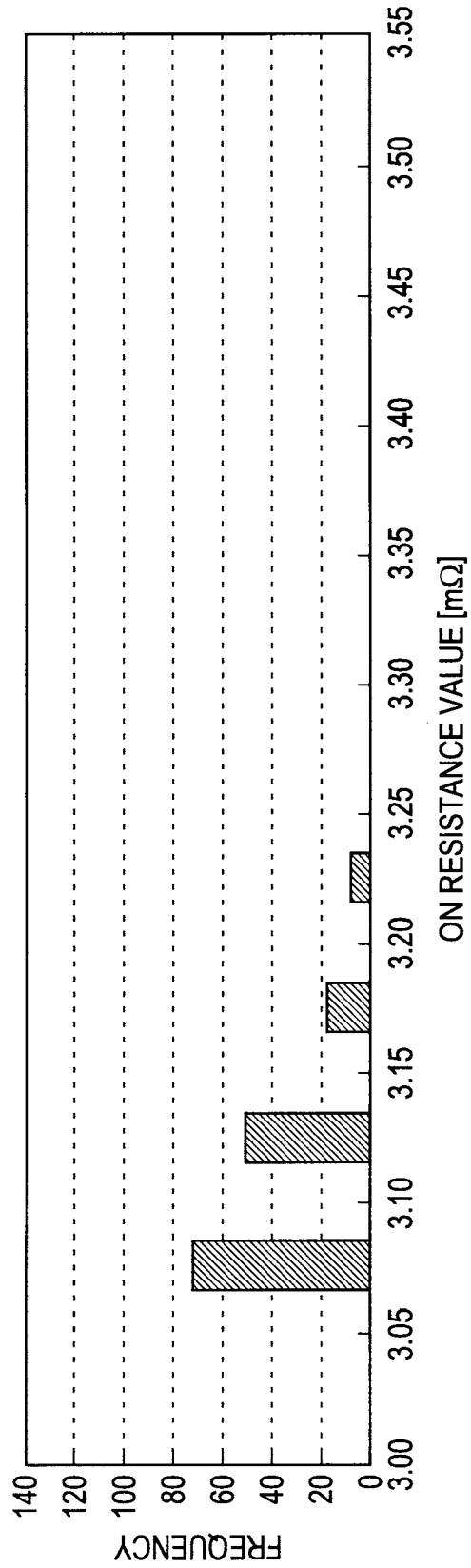
FIG. 11 is a frequency distribution graph showing the on resistance value of a semiconductor device according to Comparative Example 1.
Figure 12:
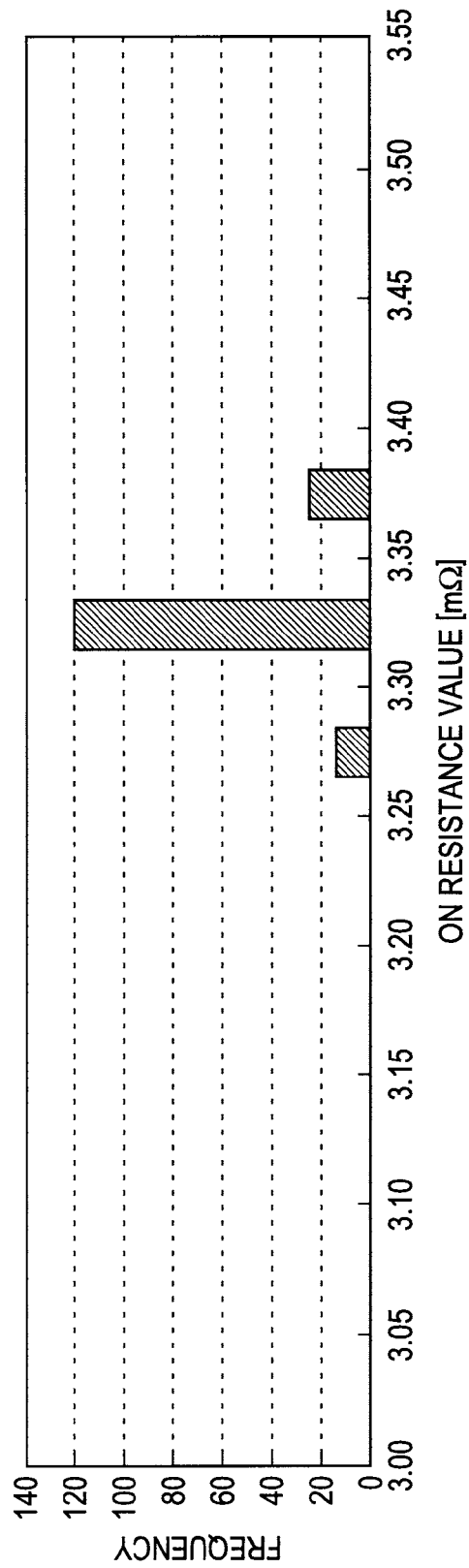
FIG. 12 is a frequency distribution graph showing the on resistance value of a semiconductor device according to Comparative Example 2.
Figure 13:
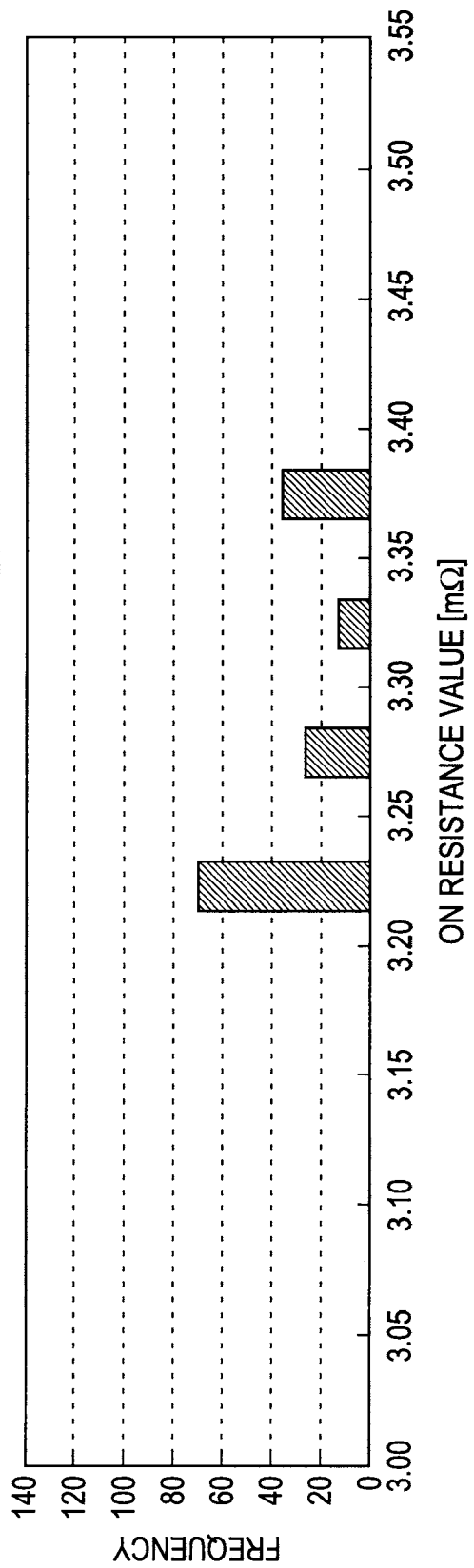
FIG. 13 is a frequency distribution graph showing the on resistance value of a semiconductor device according to Comparative Example 3.

For each of the samples of Example 1 and Comparative Examples 1 to 3, an on resistance value was measured. The on resistance value was measured under the conditions at a gate-source voltage VGS=−10 V and at a drain current ID=−20 A. FIG. 7 shows a frequency distribution graph of the on resistance value for the sample of Example 1. In FIG. 7, the abscissa denotes the on resistance value (mΩ) and the ordinate shows the frequency within the range of the on resistance value (mΩ) indicated on the abscissa. In the same manner, FIG. 11 shows a frequency distribution chart of the on resistance value according to Comparative Example 1, in the same manner, FIG. 12 shows a frequency distribution chart of the on resistance value according to Comparative Example 2, and FIG. 13 shows a frequency distribution chart of the on resistance value according to Comparative Example 3. For each of the samples, about 150 specimens were manufactured and the on resistance value was measured.

When Example 1 (FIG. 7), Comparative Example 1 (FIG. 11), Comparative Example 2 (FIG. 12), and Comparative Example 3 (FIG. 13) are compared, it can be seen that Comparative Example 1 (FIG. 11) by way of vapor deposition and heat treatment steps has lower on resistance value and the variation thereof is smaller. It can be seen that the sample of Example 1 (FIG. 7) shows a good on resistance value which is equivalent with or less than that of the sample of Comparative Example 1 (FIG. 11). The on resistance value is higher in Comparative Example 2 (FIG. 12) and Comparative Example 3 (FIG. 13) than that of Example 1 (FIG. 7) and Comparative Example 1 (FIG. 11). When Comparative Example 2 (FIG. 12) and the Comparative Example 3 (FIG. 13) are compared, it can be seen that the sample of Comparative Example 3 using Al as the first metal layer at a larger work function has better on resistance value.

Although the present invention has been described above in connection with several preferred embodiments thereof, it will be appreciated by those skilled in the art that those embodiments are provided solely for illustrating the present invention, and should not be relied upon to construe the appended claims in a limiting sense.

What is claimed is:

1. A method of manufacturing a semiconductor device which includes a vertical type semiconductor element formed by using a silicon substrate, a P type impurity diffusion layer being formed at a back surface of the silicon substrate, the method comprising:

wet etching a surface of the P type impurity diffusion layer to expose a single silicon crystal surface of the P type impurity diffusion layer; and then forming a back surface electrode to have an ohmic contact with the exposed single silicon crystal surface of the P type impurity diffusion layer at a temperature of the silicon substrate of 120° C. or lower, wherein a surface layer of the back surface electrode being in direct contact with the exposed single silicon crystal surface is a metal layer having a work function of 4.5 eV or more, wherein a surface of the metal layer being in direct contact with the exposed single silicon crystal surface is defined as a first surface, a different type metal layer is further stacked over a second surface of the metal layer which is opposite to the first surface thereof.

2. The method of manufacturing a semiconductor device according to claim 1, wherein the metal layer having the work function of 4.5 eV or more is formed of at least one metal selected from a group of Ni, Au, Cr, and Pt.

3. The method of manufacturing a semiconductor device according to claim 1, wherein the back surface electrode includes a Ni layer and an Ag layer stacked in this order on the single silicon crystal surface of the P type impurity diffusion layer.

4. The method of manufacturing a semiconductor device according to claim 1, wherein the P type impurity diffusion layer has an impurity concentration of from $5 \times 10^{18}$ to $5 \times 10^{20}$ cm$^{-3}$.

5. The method of manufacturing a semiconductor device according to claim 1, wherein the silicon substrate and the p type impurity diffusion layer are a single P type silicon substrate.

6. The method of manufacturing a semiconductor device according to claim 1, wherein the P type impurity diffusion layer is formed by diffusing P type impurities to the back surface of the silicon substrate.

7. The method of manufacturing a semiconductor device according to claim 1, wherein the vertical type semiconductor element comprises a MOSFET.

8. The method of manufacturing a semiconductor device according to claim 1, wherein the vertical type semiconductor element comprises an IGBT.

9. The method of manufacturing a semiconductor device according to claim 1, wherein the wet etching removes non-single crystal silicon to expose the single silicon crystal surface of the P type impurity diffusion layer.

* * * * *